United States Patent [19]

Kojima

[11] Patent Number: 4,497,777
[45] Date of Patent: Feb. 5, 1985

[54] APPARATUS FOR PRODUCING MONOCRYSTALLINE SILICON

[75] Inventor: Masakatu Kojima, Yokosuka, Japan

[73] Assignee: Tokyo Shibaura Denki Kabushiki Kaisha, Japan

[21] Appl. No.: 370,913

[22] Filed: Apr. 22, 1982

[30] Foreign Application Priority Data

Apr. 28, 1981 [JP] Japan .................................. 56-63249

[51] Int. Cl.³ ............................................. C30B 15/00
[52] U.S. Cl. ..................................... 422/249; 156/607
[58] Field of Search ......... 156/617 SP, 607, DIG. 64; 422/249

[56] References Cited

U.S. PATENT DOCUMENTS 3,002,824 10/1961 Francois ........................ 156/617 SP
4,167,554 9/1979 Fisher ............................ 156/617 SP

FOREIGN PATENT DOCUMENTS 2007200 8/1971 Fed. Rep. of Germany .

OTHER PUBLICATIONS

Hawley, Condensed Chemical Dictionary, 8th Ed., p. 783, 1971, Van Nostrand Reinhold, N.Y.
T. Y. Tan et al., Applied Physics Letters, vol. 30, No. 4, pp. 175-176, (2/15/1977), "Intrinsic Gettering by Oxice Precipitate Induced Dislocations in Czochralski Si.".
L. D. Katz, et al., Journal Electrochemical Society, vol. 125, No. 7, pp. 1151-1155, (Jul., 1978), "High Oxygen Czochralski Silicon Crystal Growth Relationship to Epitaxial Stacking Faults."

Primary Examiner—Hiram H. Bernstein
Attorney, Agent, or Firm—Finnegan, Henderson, Farabow, Garrett & Dunner

[57] ABSTRACT

An apparatus for producing monocrystalline silicon uniformly containing oxygen at a high concentration. The invention provides an apparatus that employs an improvement in the Czochralski method for producing monocrystalline silicon. The apparatus includes an annular shaped member which floats on the surface of the silicon melt and prevents the escape of oxygen from the silicon melt. The member rotates around a pull of monocrystalline silicon which is pulled through the aperture of the member. The member preferably is made of quartz which supplies oxygen to the silicon melt and thereby increases the concentration of oxygen in the melt.

2 Claims, 3 Drawing Figures

APPARATUS FOR PRODUCING MONOCRYSTALLINE SILICON

BACKGROUND OF THE INVENTION

1. Field of the Invention

The present invention relates to a method and an apparatus for producing monocrystalline silicon. More specifically, the present invention relates to a method and an apparatus for producing monocrystalline silicon which uniformly contains oxygen at a high concentration.

2. Description of the Prior Art

The Czochralski method is known as a method for producing monocrystalline silicon for semiconductor elements. The Czochralski method and an apparatus used in this method will be described with reference to FIG. 1.

FIG. 1 is a sectional view of an apparatus used in the Czochralski method. As shown in FIG. 1, silicon melt 6 is held in a quartz crucible 1. The silicon melt 6 is heated by a heater 2 through the quartz crucible 1 and a carbon crucible 3 supporting it. A rotating shaft 9 is provided with the carbon crucible 3, so that the crucibles 1 and 3 are rotated by rotary means (not shown) connected to the rotating shaft 9. The crucibles 1 and 3 are rotated so as to attain a uniform temperature profile of the silicon melt 6. In order to produce monocrystalline silicon, a pulling shaft 4 with a monocrystalline seed 5 mounted at the lower tip thereof is lowered to dip the seed 5 in the silicon melt 6. Thereafter, the pulling shaft 4 is slowly pulled while being rotated in the direction opposite to the rotating direction of the quartz crucible 1.

The above operation is performed in an inert atmosphere such as argon filled in a sealing vessel 8. This is to prevent reaction of the silicon melt 6 at a high temperature with oxygen, nitrogen or the like. However, even if the operation is performed within the sealing vessel 8, produced monocrystalline silicon still contains oxygen to a concentration of $10^{17}$ to $10^{18}$ atoms/cm$^3$. Silica (SiO$_2$) of the quartz crucible 1 is known to be the source of this oxygen. When monocrystalline silicon thus obtained is formed into a substrate and is annealed, microdefects are formed due to the presence of oxygen. Therefore, it is necessary to reduce the concentration of oxygen in the crystals in order to prevent the formation of such microdefects.

Meanwhile, there is another trend which attempts to positively utilize oxygen in the crystals. When silicon containing a large quantity of oxygen is annealed at a relatively high temperature (e.g., 1,050° C.), oxygen precipitates to form microdefects. The precipitated oxygen further causes microdefects such as a dislocation loop or a lamination defect. These micro-defects tend to trap impurities. Therefore, if precipitated oxygen or resultant defects are formed only near the center of the silicon substrate in the direction of thickness, these defects trap the impurities which would, if not trapped, cause microdefects or lamination defects in the surface layer of the substrate during manufacture of semiconductor elements. In this manner, a silicon substrate with a pure surface layer void of defects may be obtained. This is known as an intrinsic gettering effect. In order to precipitate oxygen only at the center of the silicon substrate in the direction of thickness, it suffices to anneal a silicon substrate containing oxygen. When such a silicon substrate is annealed, oxygen in the surface layer of the substrate is released to the outside of the substrate due to heat, and oxygen at the center of the substrate remains. In order to utilize the intrinsic gettering effect with good efficiency and reproducibility, monocrystalline silicon of the silicon substrate must contain oxygen uniformly and at a high concentration.

SUMMARY OF THE INVENTION

It is an object of the present invention to provide a method for producing monocrystalline silicon which contains oxygen at a high concentration.

It is another object of the present invention to provide a method for producing monocrystalline silicon which uniformly contains oxygen.

It is still another object of the present invention to provide an apparatus suitable for practicing the above method.

According to an aspect of the present invention, there is provided a method of producing monocrystalline silicon, comprising the steps of:

melting polycrystalline silicon in a quartz crucible to prepare a silicon melt;

floating a member, for preventing escape of oxygen in the silicon melt, on the surface of the silicon melt except an area thereof through which monocrystalline silicon is pulled; and pulling monocrystalline silicon by dipping a monocrystalline seed in the silicon melt and by slowly pulling and rotating the monocrystalline seed while rotating the quartz crucible and while rotating the member around monocrystalline silicon.

According to another aspect of the present invention, there is also provided an apparatus for producing monocrystalline silicon, comprising:

a quartz crucible for holding a silicon melt;

means for rotating said quartz crucible;

a heater which is arranged outside the quartz crucible and which heats the silicon melt held in said quartz crucible;

a member of substantially annular shape floated on the silicon melt;

means, connected to said annular member through a connecting member, for rotating said member of substantially annular shape;

a monocrystalline seed to be dipped in the silicon melt through the hole of said member of substantially annular shape; and means, connected to the monocrystalline seed, for slowly pulling the monocrystalline seed while rotating the seed.

DETAILED DESCRIPTION OF THE PREFERRED EMBODIMENTS

As stated above, in order to effectively utilize the intrinsic gettering effect, monocrystalline silicon must contain oxygen at a high concentration. In the conventional method for producing monocrystalline silicon described above, oxygen in quartz (SiO$_2$) of the crucible is supplied to the silicon melt. However, part of the supplied oxygen escapes from the surface of the silicon melt. In order to prevent this escape of oxygen, according to a preferred embodiment of the present invention, an annular member is made to float on the surface of the silicon melt. If this annular member is made of quartz, the concentration of oxygen in silicon may further be increased since oxygen is supplied from this annular member as well. In order to obtain a uniform temperature profile of the silicon melt and a uniform oxygen distribution in the silicon melt, the quartz member must be rotated. Since the quartz crucible holding the silicon melt is rotated, the silicon melt also rotates due to its viscosity. Therefore, the quartz member rotates only if it is simply placed to float on the silicon melt. However, since it is possible to control the content of oxygen in silicon by adjustment of the rotational frequency of the quartz member, it is preferable to connect the quartz member to a means for rotating it.

Figure 1:
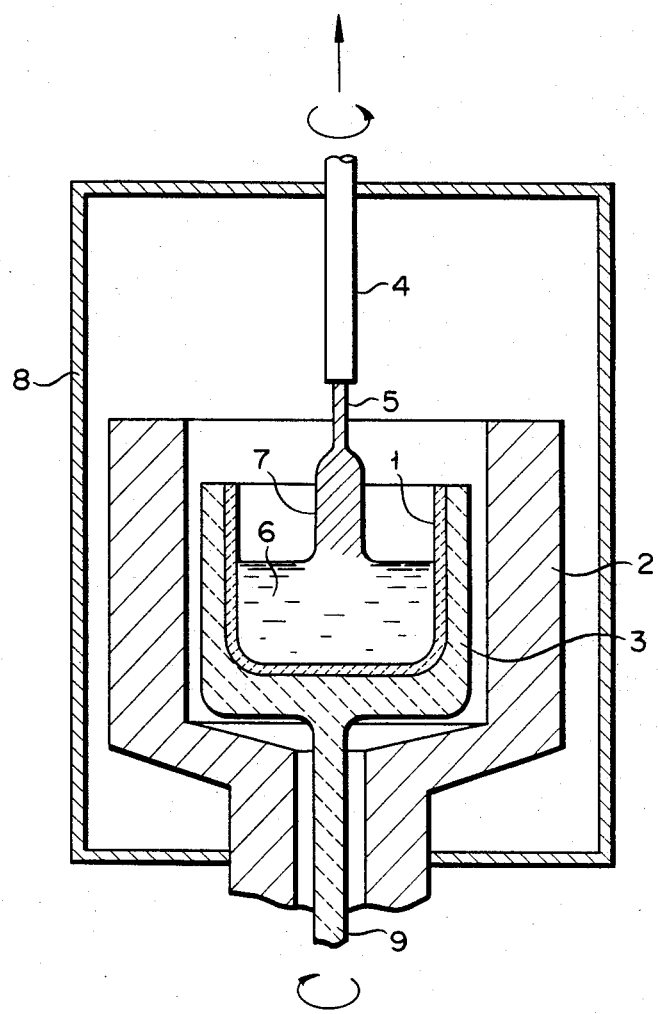
FIG. 1 is a sectional view of a conventional apparatus for producing monocrystalline silicon.
Figure 2:
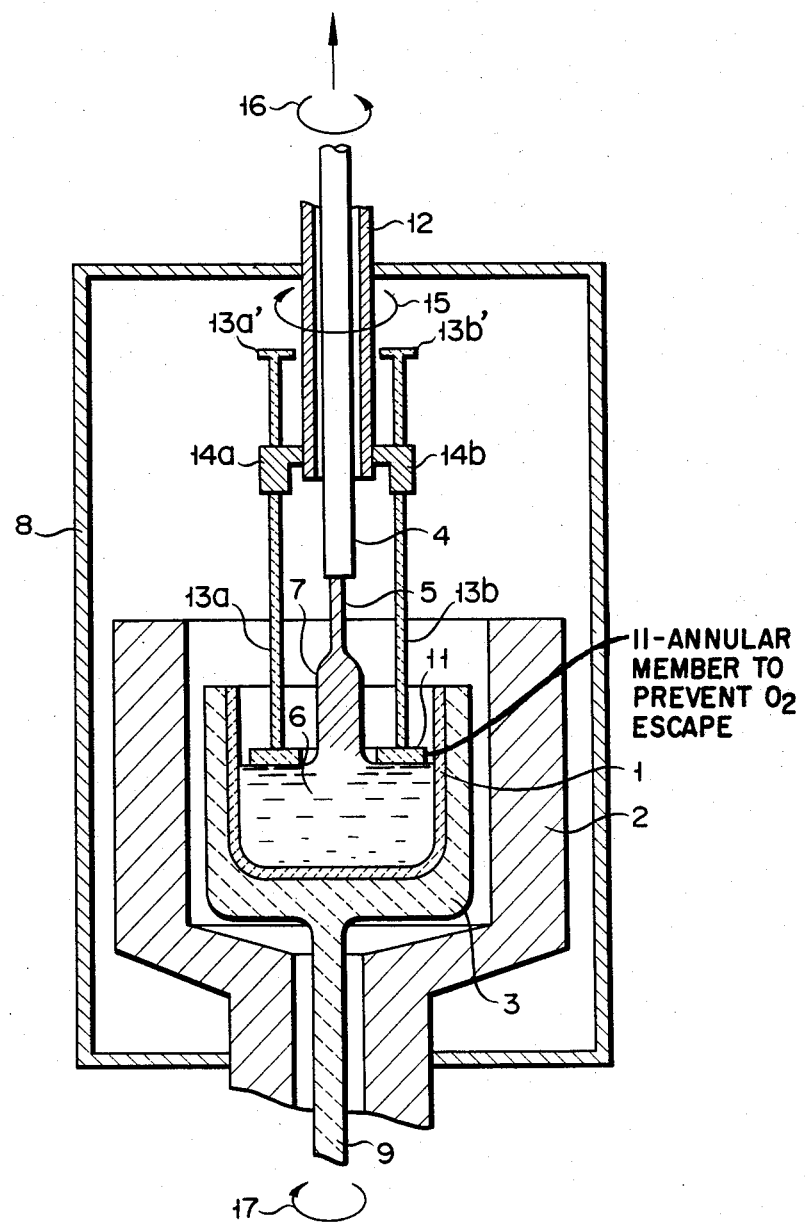
FIGS. 2 and 3 are sectional views of the apparatus for producing monocrystalline silicon according to the present invention.
Figure 3:
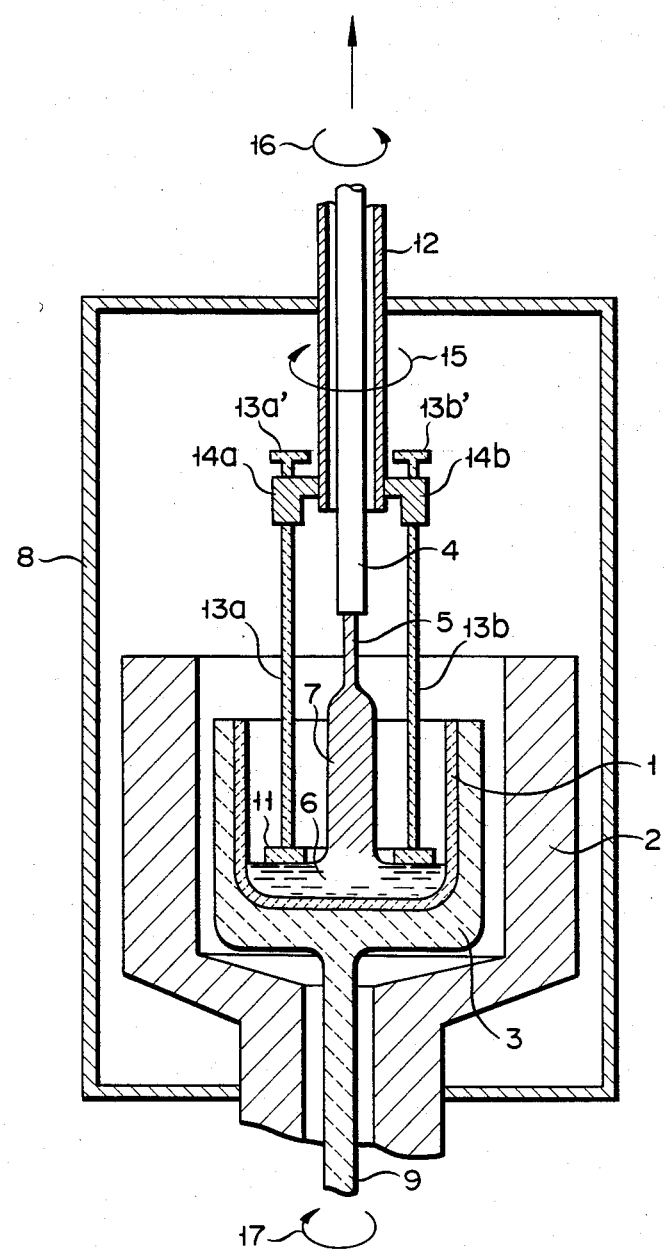

An apparatus suitable for practicing the method of the present invention will now be described in further detail with reference to FIGS. 2 and 3. In FIGS. 2 and 3, the same reference numerals as those of the conventional apparatus shown in FIG. 1 denote the same parts. The silicon melt 6 is held in the quartz crucible 1 and is heated by the heater 2. The quartz crucible 1 is held in a carbon crucible 3 which is connected to a rotary means (not shown) through the rotating shaft 9.

An annular quartz member 11 is made to float on the silicon melt 6. The thickness of the quartz member 11 is about the same as that of the quartz crucible 1, which is about 3 mm. Four quartz connecting members 13a and 13b (the remaining two being omitted from the drawings) are fixed to the quartz member 11. The upper part of the connecting member 13a slidably extends through an arm member 14a. One end of the arm member 14a is fixed to a hollow rotating shaft 12. The connecting member 14b and the remaining two connecting members (not shown) are also of the same arrangement as that of the connecting member 13a. The rotating shaft 12 is connected to a rotary means (not shown) and rotates in the direction indicated by arrow 15. The rotation of the rotating shaft 12 is transmitted to the quartz member 11 through the arm members and the connecting members. The quartz member 11 thus rotates. Stop flanges 13a' and 13b' for preventing disengagement of the connecting members from the corresponding arm members are formed at the upper ends of these connecting members. Therefore, even if the silicon melt 6 is not held in the quartz crucible 1, the connecting members 13a, 13b and so on will not disengage from the arm members 14a, 14b and so on due to the engagement of the stop flanges 13a', 13b', and so on with the arm members 14a, 14b and so on. The rotating shaft 12 is also movable in the vertical direction.

The pulling shaft 4 extends coaxially within the rotating shaft 12. The upper end of the pulling shaft 4 is connected to a pulling/rotary means (not shown) for slowly pulling the pulling shaft 4 while rotating it in the direction indicated by arrow 16. The monocrystalline seed 5 is mounted on the lower end of the pulling shaft 4. As in the case of the conventional device, the device of the present invention is placed in the sealing vessel 8. Monocrystalline silicon is pulled in an inert gas, such as argon, filled in the sealing vessel 8.

Monocrystalline silicon is produced with the device as described above in the manner to be described below. Polycrystalline silicon is first placed in the quartz crucible 1. At this time, the quartz member 11 is suspended above the quartz crucible 1 by moving the rotating shaft 12 upward. After filling the interior of the sealing vessel 8 with argon, polycrystalline silicon in the quartz crucible 1 is heated and melted by the heater 2 while rotating the quartz crucible 1 in the direction indicated by arrow 17. After the polycrystalline silicon melts to provide the silicon melt 6, the rotating shaft 12 is lowered and the quartz member 11 is floated on the surface of the silicon melt 6. During this operation, as shown in FIG. 2, the rotating shaft 12 is sufficiently lowered so that the arm members 14a, 14b and so on are sufficiently spaced apart from the corresponding flanges 13a', 13b', and so on. The quartz member 11 and the connecting members 14a, 14b and so on float on the silicon melt 6 only by the buoyancy of the quartz member 11. The rotating shaft 12 is rotated in the direction indicated by arrow 15 to rotate the quartz member 11 thereby.

Since the quartz member 11 is annular in shape, it has a hole at the center. The monocrystalline seed 5 is dipped in the silicon melt 6 through this hole of the quartz member 11. The pulling shaft 4 is slowly pulled while being rotated in the direction indicated by arrow 16. Then, monocrystalline silicon 7 grows around the monocrystalline seed 5. The inner diameter of the quartz member 11 is preferably selected to be 1.2 times or more the diameter of monocrystalline silicon 7 so that the quality of monocrystalline silicon 7 will not be degraded by dislocation within monocrystalline silicon 7 or nonuniform temperature gradient of silicon melt 6. The outer diameter of the quartz member 11 is set to be slightly smaller than the inner diameter of the quartz crucible 1, so that the quartz member 11 may be vertically movable along the inner wall of the quartz crucible 1.

The surface level of the silicon melt 6 lowers when monocrystalline silicon 7 is pulled. Since the quartz member 11 is simply floated on the silicon melt 6, the quartz member 11 is lowered together with the surface level of the silicon melt 6. Therefore, the quartz member 11 remains in constant contact with the silicon melt 6. FIG. 3 shows a state wherein the surface level of the silicon melt is significantly lowered.

Although the quartz member 11 is preferably annular in shape as in the above embodiment, it may be of polygonal shape. Alternatively, a plurality of members may be floated in an annular shape on the silicon melt 6. The quartz member 11 needs only to provide a substantially annular shaped shield.

According to the present invention, monocrystalline silicon uniformly containing oxygen at a high concentration is obtained. The present inventors manufactured monocrystalline silicon with the apparatus of the embodiment described above. Monocrystalline silicon obtained contained oxygen to a concentration of $0.9 \times 10^{18}$ to $1.2 \times 10^{18}$ atoms/cm$^3$. The oxygen distribution was uniform; the head portion and the tail portion of monocrystalline silicon contained substantially the same amount of oxygen (the oxygen concentration at the head portion is higher than that at the tail portion with monocrystalline silicon produced by the conventional Czochralski method).

What is claimed is:

1. An apparatus for producing a pull of monocrystalline silicon containing a high, uniform concentration of oxygen comprising:
   a crucible for holding silicon melt;
   means for rotating said crucible;
   a heater means arranged outside said crucible for heating the silicon melt held in said crucible;

a buoyant, quartz annular member to be floated on the silicon melt, said annular member being capable of both supplying oxygen to the silicon melt to increase the concentration of oxygen in the melt and preventing the escape of oxygen from the silicon melt;

said quartz annular member having an aperture which is larger than the diameter of the pull of monocrystalline silicon to be produced so that the pull of monocrystalline silicon will not contact or react with the annular member and having an outer periphery slightly smaller than the inner periphery of the crucible to permit the annular member to slide within the crucible;

pulling means for dipping a monocrystalline seed in the silicon melt through the aperture of said quartz annular member, rotating the monocrystalline seed while it is in the melt, and pulling the monocrystalline seed out of the melt as it is rotated to form a pull of monocrystalline silicon containing a high, uniform concentration of oxygen;

annular member rotation means independent of said silicon melt to rotate the quartz annular member in a direction opposite to the direction of rotation of the monocrystalline seed to obtain a more uniform temperature profile and oxygen distribution in the silicon melt; and wherein the diameter of the aperture of said annular member is not less than 1.2 times the diameter of the pull of monocrystalline silicon to be produced.

2. The apparatus of claim 1 further comprising means for controlling the rotational frequency of said annular member rotation means to thereby control the content of oxygen in the silicon melt.

* * * * *